United States Patent
Galster et al.

[11] Patent Number: 5,808,273
[45] Date of Patent: *Sep. 15, 1998

[54] PROCESS FOR TUNING A MAGNETO-RESISTIVE SENSOR

[75] Inventors: Rudolf Galster, Gerlingen; Guenter Gerlach, Rastatt; Anton Dukart, Woerth; Klaus Marx; Franz Jost, both of Stuttgart, all of Germany

[73] Assignee: Robert Bosch GmbH, Stuttgart, Germany

[*] Notice: This patent issued on a continued prosecution application filed under 37 CFR 1.53(d), and is subject to the twenty year patent term provisions of 35 U.S.C. 154(a)(2).

[21] Appl. No.: 637,728
[22] PCT Filed: Oct. 7, 1994
[86] PCT No.: PCT/DE94/01172
  § 371 Date: Apr. 26, 1996
  § 102(e) Date: Apr. 26, 1996
[87] PCT Pub. No.: WO95/12128
  PCT Pub. Date: May 4, 1995

[30] Foreign Application Priority Data

Oct. 26, 1993 [DE] Germany ............ 43 36 482.9

[51] Int. Cl.⁶ .................................................. B23K 26/00
[52] U.S. Cl. ................... 219/121.69; 219/121.85; 338/32 H; 338/195; 29/610.1
[58] Field of Search .............. 219/121.68, 121.69, 219/121.83, 121.85; 324/207.2, 207.21, 251, 252; 29/602.1, 610.1, 593; 338/32 R, 32 H, 195

[56] References Cited

U.S. PATENT DOCUMENTS

| | | | |
|---|---|---|---|
| 3,046,458 | 7/1962 | Basiago et al. | 338/32 H |
| 3,162,932 | 12/1964 | Wood et al. | 338/32 H |
| 3,789,311 | 1/1974 | Masuda | 338/32 H |
| 3,947,934 | 4/1976 | Olson | 29/602.1 |
| 4,259,563 | 3/1981 | Madeley | 219/121.69 |
| 4,698,522 | 10/1987 | Larsen et al. | 338/32 H |

FOREIGN PATENT DOCUMENTS

| | | |
|---|---|---|
| 4221385 | 8/1991 | Germany . |
| 3-259578 | 11/1991 | Japan . |
| 4-42978 | 2/1992 | Japan . |
| 1290215 | 2/1987 | U.S.S.R. . |

OTHER PUBLICATIONS

"Sensors", vol. 5, Magnetic Sensors, Ed.: Boll und Overshott, VCH Verlag Weinheim (DE), 1989, pp. 367–369.

Petersen, Dipl.–Phys. August; "Drehzahlmessung mit magnetoresistiven Sensormodulen"; Elektronik, vol. 2, 1991, pp. 78–81.

Mech, Klaus et al; "Magnetfeldjäger"; Elrad, vol. 10, 1993; pp. 48–51.

Taschenbuch Elektrotechnik, vol. 3, Edition 1, Carl Hanser Verlag München, Vienna 1978, pp. 94–96.

Primary Examiner—Gregory L. Mills
Attorney, Agent, or Firm—Spencer & Frank

[57] ABSTRACT

A process for adjusting a magneto-resistive sensor having a pair of current contacts and a pair of voltage contacts to compensate an offset error, without additional components. The magneto-resistive sensor (10) is charged with a homogeneous, definitely oriented magnetic field, a defined control current (I) is applied between its current contacts (22, 24) and at least one of the voltage contacts (30, 32) is trimmed, for example, by a laser beam (38), during the measurement of a pseudo-Hall voltage across the voltage contacts.

8 Claims, 2 Drawing Sheets

PROCESS FOR TUNING A MAGNETO-RESISTIVE SENSOR

The invention relates to a process for adjusting a magneto-resistive sensor.

PRIOR ART

It is known to employ magneto-resistive sensors for the contactless detection of changes in state. For example, this can be an angle measurement of a rotatably seating element. A pseudo-Hall voltage is employed in connection with these magneto-resistive sensors, i.e., while a defined control current is applied to two current contacts of the sensor, the sensor is charged with a magnetic field located in the plane of the sensor by means of a permanent magnet rotating above the sensor, so that a pseudo-Hall voltage, which is proportional to the angle of the magnetization in respect to the flow direction of the control current, is present perpendicularly in respect to the flow direction. The pseudo-Hall voltage is affected by changing the direction of magnetization in respect to the direction of the current inside the magneto-resistive sensor, so that with a steady control current it is possible via the voltage signal to make deductions regarding the position of the magnet creating the magnetic field.

In the meantime it has become known to produce these magneto-resistive sensors from ferromagnetic thin films, in which a magnetically sensitive thin film of, for example, permalloy, is employed, whose output signals, which correspond to the pseudo-Hall voltage, are supplied to an electronic evaluation circuit. In this case the magneto-resistive sensors have a thin film of a binary NiFe alloy (permalloy) and have respectively one current contact on oppositely located long sides. Voltage contacts are provided on the sides of the magneto-resistive sensor extending perpendicularly with the current contacts, on which the already mentioned pseudo-Hall voltage can be picked up. Since in this case this pseudo-Hall voltage is a function of the current intensity of the applied control current and of the angle of magnetization in respect to the direction of the current, an exact symmetrical arrangement of the voltage contacts on the magneto-resistive sensor is important.

However, it is disadvantageous in connection with known production method by means of a mask layout that it is not possible to achieve an exact symmetrical arrangement of the voltage contacts. Caused by this asymmetry, so-called offset voltages occur in the picked-up pseudo-Hall voltage, which cause a distortion in the output signal and therefore a distortion of the measured result, for example the angular position of a rotating element. In this case the offset voltage contains an axial displacement in respect to the zero axis of a sine curve representing the pseudo-Hall voltage. A positive or a negative offset results, depending on the direction in which the asymmetry of the voltage contacts is formed. For compensating this offset it has already been proposed to embody one of the voltage contacts with two poles and to dispose an additional thick film potentiometer between them. It is intended to compensate for the negative or positive offset error by an appropriate adjustment of the potentiometer. However, it is disadvantageous in this connection that, besides the additional introduction of a thick film potentiometer, an additional temperature dependence of the entire magneto-resistive sensor is created, which in turn must be compensated by means of an elaborate temperature compensation.

SUMMARY AND ADVANTAGES OF THE INVENTION

The above mentioned problems of the prior art are generally overcome according to the invention by a process for adjusting a magneto-resistive sensor wherein the magneto-resistive sensor is charged with a homogeneous, definitely oriented magnetic field, a defined contral voltage is applied to its current contracts, and during the measurement of a pseudo-Hall voltage across the voltage contacts, at least one of the voltage contacts is trimmed, for example, with a laser beam.

In contrast to the above mentioned prior art problems the process for the adjustment of a magneto-resistive sensor according to the present invention offers the advantage that it is possible to make available simply constructed magneto-resistive sensors, which therefore can be manufactured in a cost-effective manner. In particular because an additional thick film resistor embodied as a potentiometer is now no longer required for the adjustment of the magneto-resistive sensors, it is possible, on the one hand, to reduce the total size of the sensors, which permits a further miniaturization of all measuring devices equipped with these sensors. On the other hand, a reduced temperature dependency of the sensors is achieved, so that additional compensation, for example via a temperature-dependent voltage source, is not necessary. Because the magneto-resistive sensor is charged with a homogeneous magnetic field, a defined control current acts on the current contacts and during the measurement of the pseudo-Hall voltage at least one of the voltage contacts is treated with a laser, it is possible in a simple manner to trim the treated voltage contact to such an extent that, when the pseudo-Hall voltage is picked up at the voltage contacts, an electrical displacement of the contact arrangement is caused. A compensation of the offset is simultaneously achieved by this displacement. Depending on whether there is a positive or a negative offset, an adjustment is performed by a laser cut from either one or the other side of the voltage contact. Trimming of the voltage contact takes place until the offset, with the magnetic field applied, equals zero.

Further advantageous embodiments and features of the invention are presented and discussed below.

BRIEF DESCRIPTION OF THE DRAWINGS

The invention will be explained in detail below by means of an exemplary embodiment, making reference to the associated drawings.

DETAILED DESCRIPTION OF THE PREFERRED EMBODIMENTS

Figure 1:
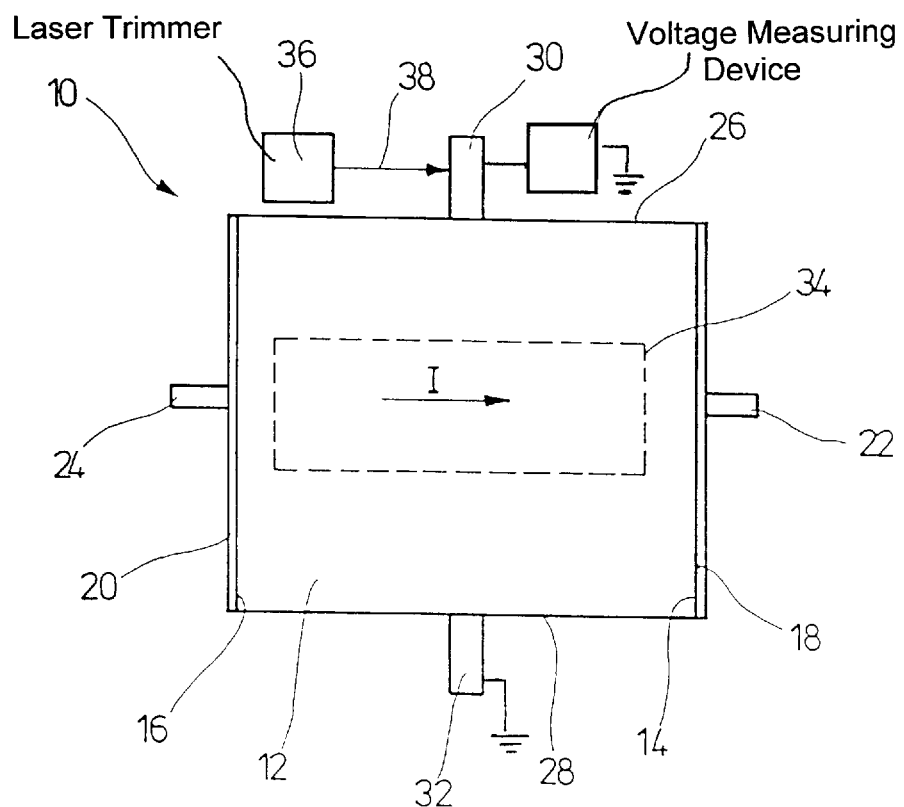
FIG. 1 is a schematic top view of a magneto-resistive sensor.

FIG. 1 shows a magneto-resistive sensor, identified in general by 10. The sensor 10 consists of a thin film 12 of NiFe (permalloy). Current contacts 18 and 20 are arranged on the long sides 14 and 16 of the thin film 12. The current contacts 18 and 20 have contact lugs 22 and 24, which can be brought into contact with a voltage source. Voltage contacts 30 and 32 are arranged on the sides 26 and 28 of the thin film 12 extending at right angles to the current contacts 18 or 20. Both the current contacts 18 and 20 and the voltage contacts 30 and 32 can be made of aluminum, for example. A permanent magnet 34, indicated here by dashed lines, is disposed above the thin film 12. The permanent magnet 34 is shown here only symbolically, since in actuality it is much larger than the sensor 10. The permanent magnet 34 is aligned exactly parallel with an imagined line passing through the contact lugs 22 or 24. A laser beam 38 from a laser generating device 36, represented only schematically, acts on the voltage contact 30.

The arrangement represented in FIG. 1 performs the following function:

A voltage source providing a defined voltage is connected to the contact lugs 22 and 24, so that an exactly defined control current I appears between the current contacts 18 and 20. The permanent magnet 34 is aligned in such a way that a magnetic field emanating from it extends exactly parallel with the direction of the current of the control current I. A reference measurement is possible because of this alignment of the permanent magnet, wherein an angle between the magnetic field of the permanent magnet 34 and the direction of the current of the control current I is exactly zero. A potential difference is created at the voltage contacts 30 and 32 based on the fact that—as already mentioned—a state is created which is a function of the current intensity and the direction of the current of the control current as well as of the angle of the magnetic field in relation to the direction of the current. This potential difference results in the so-called pseudo-Hall voltage.

The following relationship applies for a signal of the pseudo-Hall voltage:

$$V = c + A\sin 2\theta$$

In this case c is a value for the displacement of the sine curve of the pseudo-Hall voltage in respect to the zero axis, A a value for the amplitude of the pseudo-Hall voltage, and θ the already mentioned angle between the magnetic field and the control current I.

It is apparent that the output signal V of the pseudo-Hall voltage is the more affected the higher the value c of the offset is. Since the measurement arrangement represented in FIG. 1 operates with a defined control current I and a defined flux density of the magnetic field, the value c representing the offset can be determined during the pick-up of the pseudo-Hall voltage at the voltage contacts 30 and 32. The offset results in particular because, when the sensor 10 was produced, an exact symmetrical orientation of the voltage contacts 30 and 32 was not possible by means of the conventional masking process, so that the voltage drop in accordance with the contact displacement acts as an offset. A displacement of the output signal V is caused by this offset.

An electrical displacement, so to speak, of the voltage contact 30 takes place in that one voltage contact, in this example the voltage contact 30, is trimmed by the laser beam 38. A deviation, possibly existing and detected during the measurement of the pseudo-Hall voltage, i.e. the offset, is compensated by means of this electrical displacement of the voltage contact 30, so that trimming by means of the laser beam 38 can take place until a value c=0 of the offset appears. Depending on whether the offset has a positive or a negative value, trimming of the voltage contact 30 either takes place from the left side, as illustrated in the example, or from the right of the voltage contact 30.

As a result of all this it becomes clear that it is possible to achieve very exact symmetry between the voltage contacts 30 and 32 by means of this adjustment process, so that it becomes possible to reduce the offset error of the entire sensor 10 to a minimum, for example to a value of 1% of the amplitude of the pseudo-Hall voltage signal.

Figure 2:
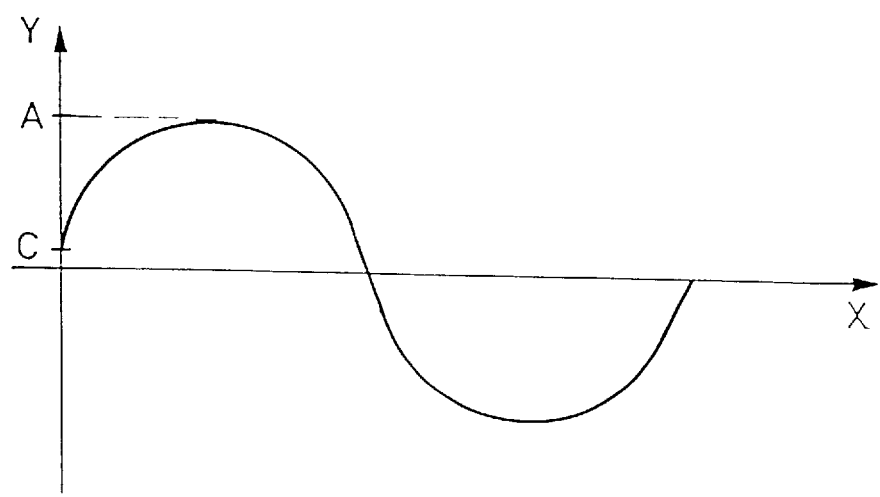
FIG. 2 shows the signal course of a pseudo-Hall voltage.

A pseudo-Hall voltage signal is represented in FIG. 2 for clarification. It becomes apparent that a sinusoidally extending pseudo-Hall voltage, for example, is displaced along the x-axis, which represents the zero passage, by the already mentioned offset error represented by the value c. In the process the value c assumes a defined, percentage-wise portion of the amplitude A of the pseudo-Hall voltage. The greater the percentage-wise portion of the value c in relation to the amplitude A, the greater the angle measurement error connected with an evaluation of the pseudo-Hall voltage.

Figure 3:
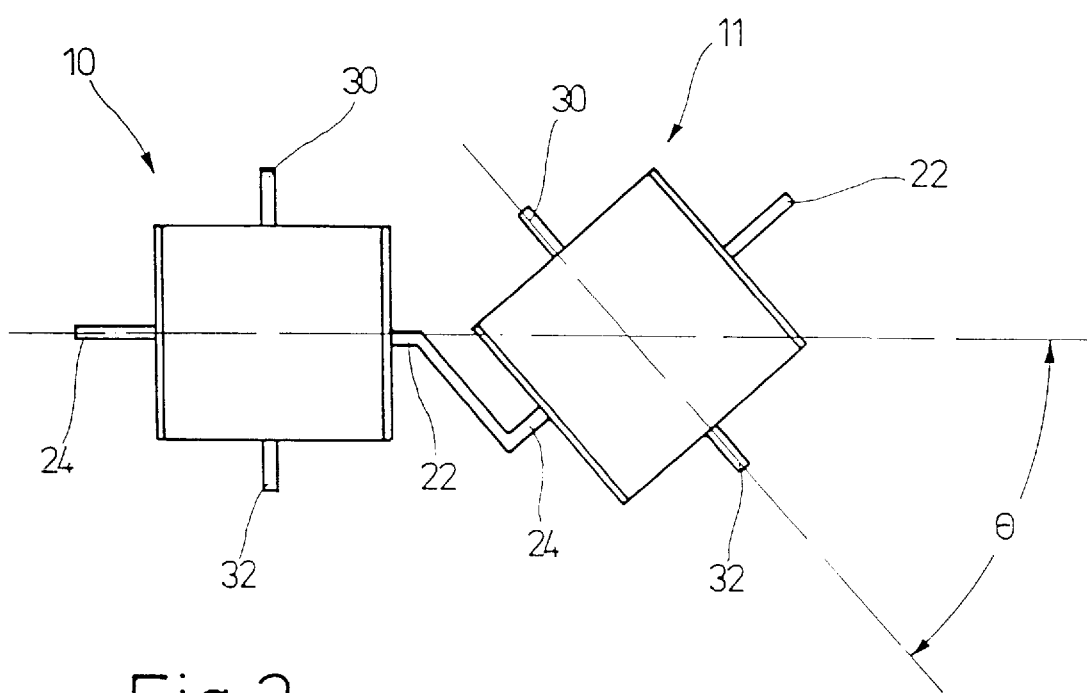
FIG. 3 is a schematic circuit arrangement of two magneto-resistive sensors.

The adjustment process in accordance with the invention is shown by way of example by means of a sensor 10. In connection with a contactless angle measurement with magneto-resistive sensors it is known to dispose two sensors next to each other, as shown in FIG. 3, wherein the first sensor 10 is turned by exactly 45° in respect to the second sensor 11. In this case the current contacts of the sensors 10 and 11 which are located opposite each other are connected with each other, so that a series connection results. By means of this arrangement of the sensors, wherein they are turned in respect to each other, it is achieved that with a magnetic field emanating from a permanent magnet disposed above the sensors 10 and 11, different pseudo-Hall voltages are generated at the voltage contacts of both sensors 10 and 11. This is the result of the different angle θ between the magnetic field and the direction of the electrical field caused by the control current I. Further details will not be discussed here, instead reference is made to the embodiment in FIG. 1.

As a whole, it should be noted that the circuit consisting of the magneto-resistive sensors 10 and 11 generates a signal which is composed of a signal $V_1$ of the first sensor, drawn in on the left here, and a signal $V_2$ of the second sensor 11. The relationship $V_1 = c_1 + A_1 \sin 2\theta$ results for $V_1$, for $V_2$ the relationship $V_2 = c_2 + A_2 \sin 2\theta$. Again, c here indicates a value for the already mentioned offset, A the respective amplitude of the pseudo-Hall voltage and θ the magnetizing angle. In this case, θ is 0° for the first sensor 10 and 45° for the second sensor 11.

So that the offset error resulting from this circuit can now be reduced, an adjustment of the first sensor 10 is performed, such as had already been explained in connection with FIG. 1. An analogous adjustment of the second sensor 11 is performed in such a way that the permanent magnet 34 is turned by exactly 45°, so that an angle θ of 0° occurs for the second sensor 11 shown in FIG. 3. It is now possible by means of the already mentioned laser trimming technique to perform an exact symmetrical alignment of the voltage contacts 30 and 32 of the second sensor 11. All in all it is possible to achieve a very high degree of accuracy of the output signal and thus of a measured result by means of the described adjustment process of the circuit of two magneto-resistive sensors 10 and 11 represented in FIG. 3. It is furthermore possible to place these sensors on a very small surface so that an arrangement of magnetic sensors which, for example is intended to measure the angle position of a rotating element, is possible in very small components.

It can also be provided that the adjustment of the circuit consisting of the sensors 10 and 11, or even of only one sensor 10, is performed dynamically. This means that the permanent magnet 34 is rotating, and in the course of several rotations the value c for the offset in respect to the exactly fixed angle position, preferably the mentioned angle positions, is determined by calculation. The trimming of the voltage contacts 30 and/or 32 can take place following a selectable measuring period. It is possible by means of this dynamic adjustment to reduce or compensate a possible measuring error during the trimming of the magneto-resistive sensors.

We claim:

1. A process for adjusting a magneto-resistive sensor having a pair of current contacts and a pair of voltage contacts extending perpendicular to an axis of the pair of current contacts, said process comprising: applying a definite control current (I) between the pair of current contacts; charging the sensor with a homogeneous magnetic field oriented parallel to the current direction of the control current, and thus at a 0° magnetization angle between the magnetic field and the direction of the control current; measuring a pseudo-Hall voltage across said pair of voltage contacts to detect a value (c) representing an offset; and, trimming a lateral surface of at least one of the voltage contacts, which surface extends transverse to the current contact axis, during the measuring of the pseudo-Hall voltage to reduce the offset value (c).

2. A process in accordance with claim 1, wherein, depending on a positive or a negative offset value (c), the at least one voltage contact is trimmed from opposite side surfaces of the contact.

3. A process in accordance with claim 1, wherein, in the course of adjustment of a circuit consisting of first and second series connected magneto-resistive sensors, they are adjusted one after the other.

4. A process in accordance with claim 3, wherein the first an second series connected magneto-resistive sensors are oriented such that their respective voltage contact axes are oriented at a defined angle with respect to each other, and further including, during the adjustment of the first magneto-resistive sensor, setting the magnetization angle of 0°, originating from a permanent magnet, in relation to the first sensor, and during the adjustment of the second magneto-resistive sensor, setting the magnetization angle of 0° in relation to the second sensor or at the defined angle in relation to the first sensor.

5. A process as defined in claim 4, wherein said defined angle is 45°.

6. A process in accordance with claim 3, wherein the adjustment is performed dynamically and, following several turns of a permanent magnet, the value (c) representing the offset is determined by calculation and then the trimming of the at least one voltage contact takes place.

7. A process in accordance with claim 1, wherein trimming of the at least one voltage contact takes place until the value (c) representing the offset has a value of 0.

8. A process as defined in claim 1, wherein said trimming is carried out by a laser beam.

* * * * *